United States Patent
Koo et al.

(10) Patent No.: US 8,669,538 B1
(45) Date of Patent: Mar. 11, 2014

(54) METHOD OF IMPROVING ION BEAM QUALITY IN AN IMPLANT SYSTEM

(71) Applicant: Varian Semiconductor Equipment Associates, Inc., Gloucester, MA (US)

(72) Inventors: Bon-Woong Koo, Andover, MA (US); Christopher J. Leavitt, Gloucester, MA (US); Peter F. Kurunczi, Cambridge, MA (US); Timothy J. Miller, Ipswich, MA (US); Svetlana B. Radovanov, Brookline, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/796,639

(22) Filed: Mar. 12, 2013

(51) Int. Cl.
*H01J 37/317* (2006.01)
*H01J 49/10* (2006.01)
*H01L 21/265* (2006.01)

(52) U.S. Cl.
USPC .......... 250/492.1; 250/423 R; 250/492.3; 315/111.51; 315/111.01; 315/111.81; 156/345.48

(58) Field of Classification Search
USPC ......... 250/492.21, 423 R, 492.3; 315/111.51, 315/111.01, 111.81; 156/345.48
See application file for complete search history.

(56) References Cited

U.S. PATENT DOCUMENTS

| | | | |
|---|---|---|---|
| 6,790,311 B2 * | 9/2004 | Collins et al. | 156/345.48 |
| 7,137,354 B2 | 11/2006 | Collins et al. | |
| 7,291,545 B2 | 11/2007 | Collins et al. | |
| 7,972,471 B2 | 7/2011 | Sant | |
| 7,999,479 B2 * | 8/2011 | Biloiu et al. | 315/111.51 |
| 8,142,607 B2 * | 3/2012 | Biloiu et al. | 156/345.39 |
| 2009/0159424 A1 | 6/2009 | Liu et al. | |

* cited by examiner

*Primary Examiner* — Nikita Wells (57) ABSTRACT

A system for improving ion beam quality is disclosed. According to one embodiment, the system comprises an ion source, having a chamber defined by a plurality of chamber walls; an RF antenna disposed on a first wall of the plurality of chamber walls; a second wall, opposite the first wall, the distance between the first wall and the second wall defining the height of the chamber; an aperture disposed on one of the plurality of chamber walls; a first gas inlet for introducing a first source gas to the chamber; and a second gas inlet for introducing a second source gas, different from the first source gas, to the chamber; wherein a first distance from the first gas inlet to the second wall is less than 35% of the height; and a second distance from the second gas inlet to the first wall is less than 35% of the height.

20 Claims, 8 Drawing Sheets

METHOD OF IMPROVING ION BEAM QUALITY IN AN IMPLANT SYSTEM

Embodiments of the present invention relate to methods and apparatus for improving ion beam quality in an ion implantation system, and more particularly, improving boron ion beam quality.

BACKGROUND

Figure 1:
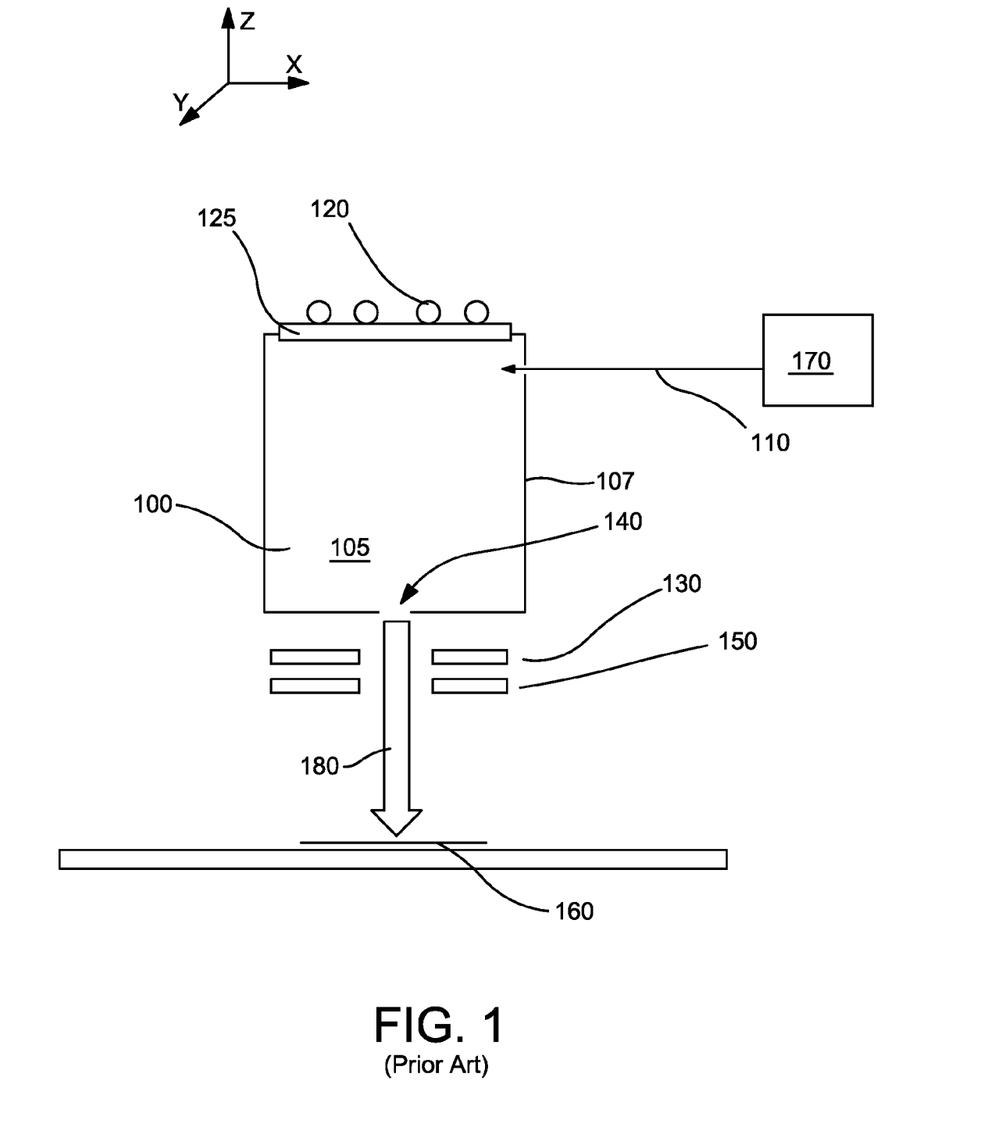
FIG. 1 shows an implant system according to the prior art.

Semiconductor workpieces are often implanted with dopant species to create a desired conductivity. For example, solar cells may be implanted with a dopant species to create an emitter region. This implant may be done using a variety of different mechanisms. In one embodiment, shown in FIG. 1, an ion source 100 is used. This ion source 100 includes a chamber 105 defined by several walls 107, which may be constructed from graphite or another suitable material. This chamber 105 may be supplied with a source gas via a gas inlet 110. This source gas may be energized by an RF antenna 120 or another mechanism. The RF antenna 120 is in electrical communication with a RF power supply (not shown) which supplies power to the RF antenna 120. A dielectric window 125, such as a quartz or alumina window, may be disposed between the RF antenna 120 and the interior of the ion source 100. The ion source 100 also includes an aperture 140 through which ions may pass. A negative voltage is applied to extraction suppression electrode 130 disposed outside the aperture 140 to extract the positively charged ions from within the chamber 105 through the aperture 140 and toward the workpiece 160. A ground electrode 150 may also be employed. In some embodiments, as shown in FIG. 1, the aperture 140 is located on the side of the ion source 100 opposite the side containing the dielectric window 125.

In an effort to improve process efficiency and lower cost, in some embodiments, the ions extracted from the ion source 100 are accelerated directly toward the workpiece 160, without any mass analysis. In other words, the ions that are generated in the ion source 100 are accelerated and implanted directly into the workpiece 160. The mass analyzer is used to remove undesired species from the ion beam 180. Removal of the mass analyzer implies that all ions extracted from the ion source 100 will be implanted in the workpiece 160. Consequently, undesired ions, which may also be generated within the ion source 100, are then implanted in the workpiece 160.

This phenomenon may be most pronounced when the source gas 170 is a halogen-based compound, such as a fluoride. Fluorine ions may react with the inner surfaces of the ion source 100, thereby releasing unwanted ions, such as silicon, carbon, and aluminum. A test was performed using $BF_3$ as the source gas, supplied at a rate of 5.5 sccm. A RF power of 2.5 kW was applied to the RF antenna 120 to energize the source gas. The chamber walls 107 of the plasma chamber 105 were biased at 10 kV, while the suppression electrode 150 was biased at −1.5 kV. In this test, it was observed that less than half of the ion beam current was comprised of the desired boron ions. Additionally, nearly one third of the total ion beam current comprises ions created due to etching of the dielectric window 125 and the chamber walls 107 within the ion source 100 by the fluoride ions.

Therefore, a system and method which improves beam quality, particular for embodiments in which halogen based source gasses are employed, would be beneficial.

SUMMARY

A system for improving ion beam quality is disclosed. The system includes an ion source. Two different source gasses are introduced into the chamber, where the inlets for the two gasses are disposed to improve the quality of the ion beam extracted from the ion source.

According to one embodiment, an ion implant system comprises an ion source, having a chamber defined by a plurality of chamber walls; an RF antenna disposed on a first wall of the plurality of chamber walls; a second wall, opposite the first wall, the distance between the first wall and the second wall defining the height of the chamber; an aperture disposed on one of the plurality of chamber walls; a first gas inlet for introducing a first source gas to the chamber; and a second gas inlet for introducing a second source gas, different from the first source gas, to the chamber; wherein a first distance from the first gas inlet to the second wall is less than 35% of the height; and a second distance from the second gas inlet to the first wall is less than 35% of the height.

According to a second embodiment, an ion implant system comprises an ion source, having a chamber defined by a plurality of chamber walls; a first dielectric window disposed on a first wall of the plurality of chamber walls and a second dielectric wall disposed on a second wall, opposite the first wall, wherein a centerline is defined as equidistant from the first wall and the second wall, and the distance between the first wall and centerline defining a critical dimension of the chamber and; an RF antenna disposed on the first dielectric window and the second dielectric window and outside the chamber; an aperture disposed on one of the plurality of chamber walls, different from the first wall and the second wall, along the centerline; a first gas inlet for introducing a first source gas to the chamber; and a second gas inlet for introducing a second source gas, different from the first source gas, to the chamber; wherein a first distance from the first gas inlet to the centerline is less than 35% of the critical dimension; and a second distance from the second gas inlet to the first wall is less than 35% of the critical dimension.

According to a third embodiment, an ion implant system comprises an ion source, having a chamber defined by a plurality of chamber walls; a dielectric window disposed on a first wall of the plurality of chamber walls; an RF antenna disposed proximate the dielectric window, outside the chamber; a second wall, opposite the first wall, the distance between the first wall and the second wall defining the height of the chamber; an aperture disposed on the second wall; a first gas inlet for introducing a first source gas to the chamber; and a second gas inlet for introducing a second source gas, different from the first source gas, to the chamber; wherein a first distance from the first gas inlet to the second wall is less than 10% of the height and a second distance from the second gas inlet to the first wall is less than 10% of the height.

BRIEF DESCRIPTION OF THE FIGURES

For a better understanding of the present disclosure, reference is made to the accompanying drawings, which are incorporated herein by reference and in which.

DETAILED DESCRIPTION

As described above, ionization of halogen-based species, such as fluorides, may cause particles released from the inner surfaces of the ion source to be implanted in the workpiece. One approach to address the damage caused by free halogen ions may be to introduce a second source gas, such as one comprising a deposition-based species, such as a hydride. For example, species, such as $B_2H_6$ or $B_{10}H_{22}$ or $C_2B_{10}H_{12}$ (carborane), may be introduced to alleviate the effects of the fluorides. Both source gasses may include the same dopant, such as boron. In other embodiments, different dopants may be used. These dopants may have the same conductivity. For example, two different Group III elements, such as boron and gallium, or two different Group V elements, such as phosphorus and arsenic, may be used. Although a hydride is described, the second source gas may be any species that tends to create a deposition on the inner surfaces of the ion source 100. Thus, throughout this disclosure, the terms "hydride-based source gas", "second source gas" and "deposition forming source gas" are used interchangeably to refer to a source gas which contains elements which tend to form a deposition, coating or film on the inside of the chamber 105, and specifically on the dielectric window 125. Similarly, the terms "halogen-based source gas", "first source gas" and "etching source gas" are used interchangeably to refer to a source gas that contains an element which tends to etch the inside of the chamber 105, and particularly the dielectric window 125. Thus, it is possible that the second source gas may not include a hydride and the first source gas may not include a halogen. These are merely examples of a first source gas and a second source gas.

As described above, the second source gas may be used to create a film or coating on the dielectric window 125. This serves to protect the dielectric window 125, which reduces the amount of contaminants originating from the dielectric window 125 that are contained in the extracted ion beam 180. In addition, the second source gas may coat the inner surfaces of the plasma chamber walls 107, which may be another source of contaminants. In some configurations, the largest source of contamination is the dielectric window 125. Because the surface of the dielectric window 125 is biased by RF capacitive coupling, it is bombarded by ions. In contrast, the walls 107 may function as a plasma ground and therefore the energy of ion bombardment may be lower. However, due to their large surface area, the walls 107 may also contribute to the contamination. A second test, where the test conditions described above are held constant was performed. The difference between this test and the previously described test is that in this case, the ion beam 180 was extracted after the dielectric window 125 had been previously coated, such as by using a hydride-based source gas. It was observed that the coating on the dielectric window 125 causes a significant reduction in contaminants caused by the etching of silicon dioxide and the graphites on the inner surfaces of the plasma chamber 105, and also results in an increase in the percentage of boron ions in the beam current.

However, it has been observed that, when a halogen-based source gas 170 and a second hydride-based source gas are used simultaneously, the halogen-based source gas 170 may tend to etch the dielectric window 125 over time, causing contaminant ions to be extracted. In other words, the etching effect of the halogen-based source gas 170 may dominate the coating effect of the second hydride-based source gas.

Figure 2:
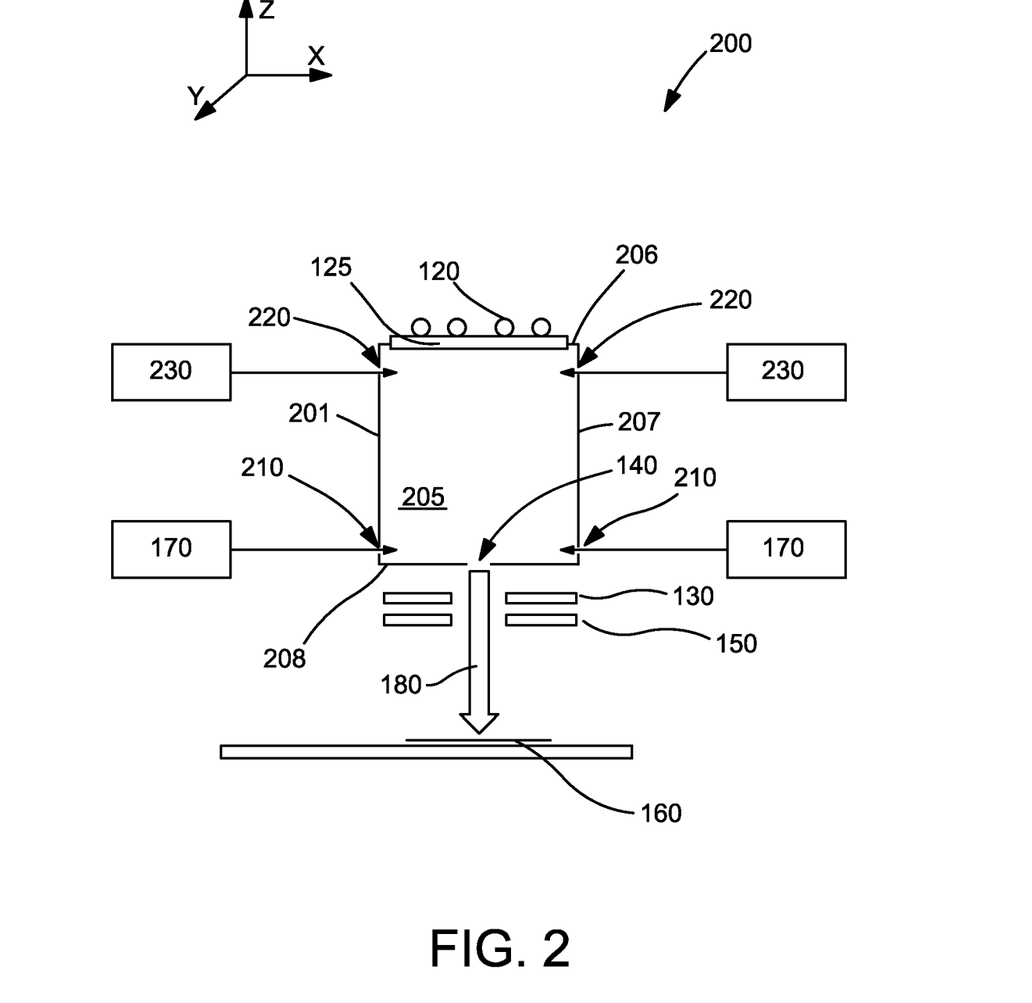
FIG. 2 shows an embodiment of an implant system that can be used in one embodiment.

FIG. 2 shows a first embodiment of implant system 200, which achieves an improved ion beam quality without sacrificing ion beam current. The chamber 205 is defined by sidewalls 207, a first wall 206 where the dielectric window 125 is disposed and a second wall 208. The term "chamber walls" is intended to include the sidewalls 207, the first wall 206 and the second wall 208. Furthermore, in this disclosure, the height of the chamber refers to the Z direction, the width of the chamber refers to the X direction, while the length refers to the Y direction.

The first source gas 170, which may etch the dielectric window 125, is introduced to the ion source 201 at a first gas inlet 210 distal from the dielectric window 125. This first gas inlet 210 may be disposed proximate the aperture 140. As described above, the aperture 140 may be typically located on the wall 208 opposite the wall that containing the dielectric window 125. In one embodiment, the height of the chamber 205, which is defined as the distance between the top wall 206 and the wall opposite the top wall 206 (i.e. bottom wall 208), may be about 20-30 cm. The first gas inlet 210 may be disposed on a sidewall 207 within 2 cm of the second wall 208 containing the aperture 140. In other words, the spacing between the first gas inlet 210 and the second wall 208 is within about 10% of the total height of the chamber 205. The second source gas 230 may be introduced to the ion source 201 at a second gas inlet 220, which may be near the dielectric window 125, such as disposed on a sidewall 207 within 2 cm of first wall 206. In other words, the spacing between the second gas inlet 220 and the first wall 206 is within about 10% of the total height of the chamber 205. The source gasses 170, 230 also may be introduced at other locations along the side walls 207. For example, in another embodiment shown in FIG. 3, in ion implant system 250, the distance between the first gas inlet 210 and the second wall 208 may be within about 25% of the total height of the chamber 205. Similarly, the distance between the second gas inlet 220 and the first wall 206 may be within about 25% of the total height of the chamber 205. In another embodiment, the distance between the first gas inlet 210 and the second wall 208 may be within about 35% of the total height of the chamber 205. Similarly, the distance between the second gas inlet 220 and the first wall 206 may be within about 35% of the total height of the chamber 205. In another embodiment, the first gas inlet 210 is disposed along the lower half of sidewall 207, while second gas inlet 220 is disposed along the upper half of sidewall 207. In yet another embodiment, the second gas inlet 220 is disposed on a sidewall 207, closer to the dielectric window 125 than the first gas inlet 210.

Figure 7:
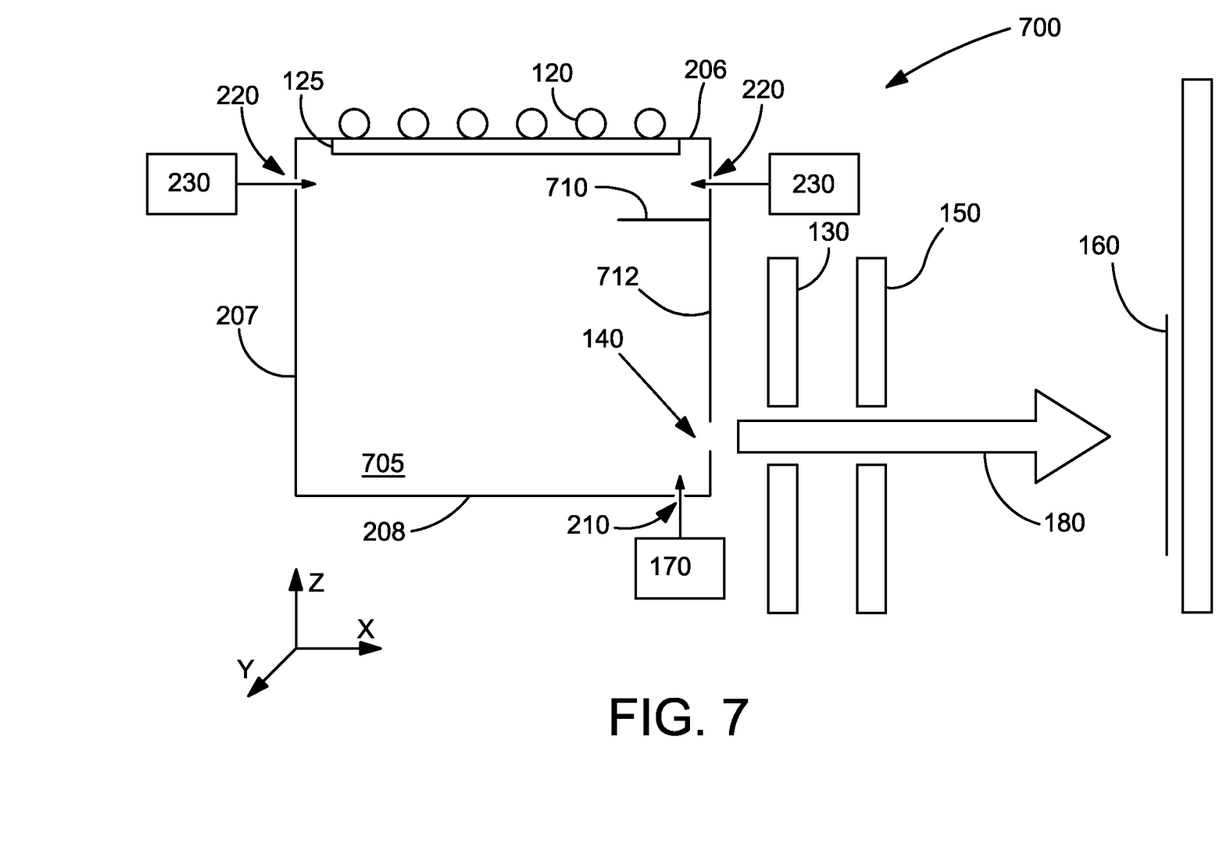
FIG. 7 shows an embodiment of an implant system that can be used in another embodiment.

In some embodiments, the aperture 140 may not be disposed on the second side 208, opposite the dielectric window 125. In these embodiments, the first gas inlet 210 of the first source gas 170 may be disposed near the side opposite the dielectric window 125, regardless of the position of the aperture 140. An ion implant system 700 is shown in FIG. 7, where the aperture 140 is disposed in one of the sidewalls 207. In some embodiments, the aperture 140 may be disposed in sidewall 712 at a position that is closer to second wall 208 than to first wall 206. In this embodiment, the ion beam 180 exits the chamber 705 in the X direction (or Y direction) through sidewall 712. In some embodiments, the first inlet 210 is located on the second wall 208. The first gas inlet 210 may be disposed on the second wall 208 near the sidewall 712. As described above, the height of the chamber 705 is defined as the distance from the first wall 206, near which the antenna 120 is disposed, to the second wall 208, which is opposite the first wall 206. Thus, as described above, the distance from the first gas inlet 210 to the second wall 208 is within 35% of the height of the chamber 705. It is also within 25% of the height and within 10% of the height of the chamber 705. Similarly, the second gas inlet 220 is within these distances of the first wall 206. A partition 710 may optionally be disposed on sidewall 712 between the second gas inlet 220 and the aperture 140 to help separate the first source 170 from the second source gas 230, as described in more detail below. In this embodiment, the first inlet 210 is disposed on the second wall 208, however other embodiments are possible.

For example, in other embodiments, the first gas inlet 210 may be located near the aperture 140 regardless of its position. Referring to FIG. 7, the first inlet 210 may be disposed on the sidewall 712 where the aperture 140 is disposed. For example, the first gas inlet 210 may be disposed on the sidewall 712 beneath the aperture 140, such that its distance from the second wall 208 is within 35% of the height of the chamber 705. In some embodiments, its distance may be within 25% of the height of the chamber 705. In still other embodiments, its distance may be within 10% of the height of the chamber 705. In this embodiment, a partition 710 may optionally be disposed on sidewall 712 between the second gas inlet 220 and the aperture 140.

In another embodiment, the first gas inlet 210 may be disposed on the sidewall 712 above the aperture 140 such that the distance from the first gas inlet 210 to the second wall 208 is within 35% of the height. In some embodiments, its distance may be within 25% of the height of the chamber 705. In still other embodiments, its distance may be within 10% of the height of the chamber 705. The distance from the second gas inlet 220 to the first wall 206 may be within these ranges as well. In this embodiment, a partition 710 may optionally be disposed on sidewall 712 between the second gas inlet 220 and the first gas inlet 210. In this way, ions from the first source gas 170 are generated near the aperture 140 and interact less with the chamber walls 207 and the dielectric window 125.

Surprisingly, although the interior of the ion source 201 is at a pressure in the millitorr range, the first source gas 170 and the second source gas 230 may not expand to fill the chamber 205 uniformly. In fact, it has been observed that the introduction of the second source gas 230 near the dielectric window 125 may hinder the diffusion of the first source gas 170 to the region of the chamber 205 near this dielectric window 125. This allows the dielectric window 125 to be coated by the second source gas 175. This coating serves to minimize the amount of contaminants that are released by the dielectric window 125. At the same time, introduction of the first source gas 170 away from the dielectric window 125 still allows ionization of this first source gas 170, which results in an ion beam of the desired beam current. Thus, the placement of the first and second gas inlets 210, 220 at which the etching first source gas and the deposition-forming second source gas, respectively, are introduced to the ion source 201 may allow improved ion beam quality without sacrificing ion beam current.

Figure 3:
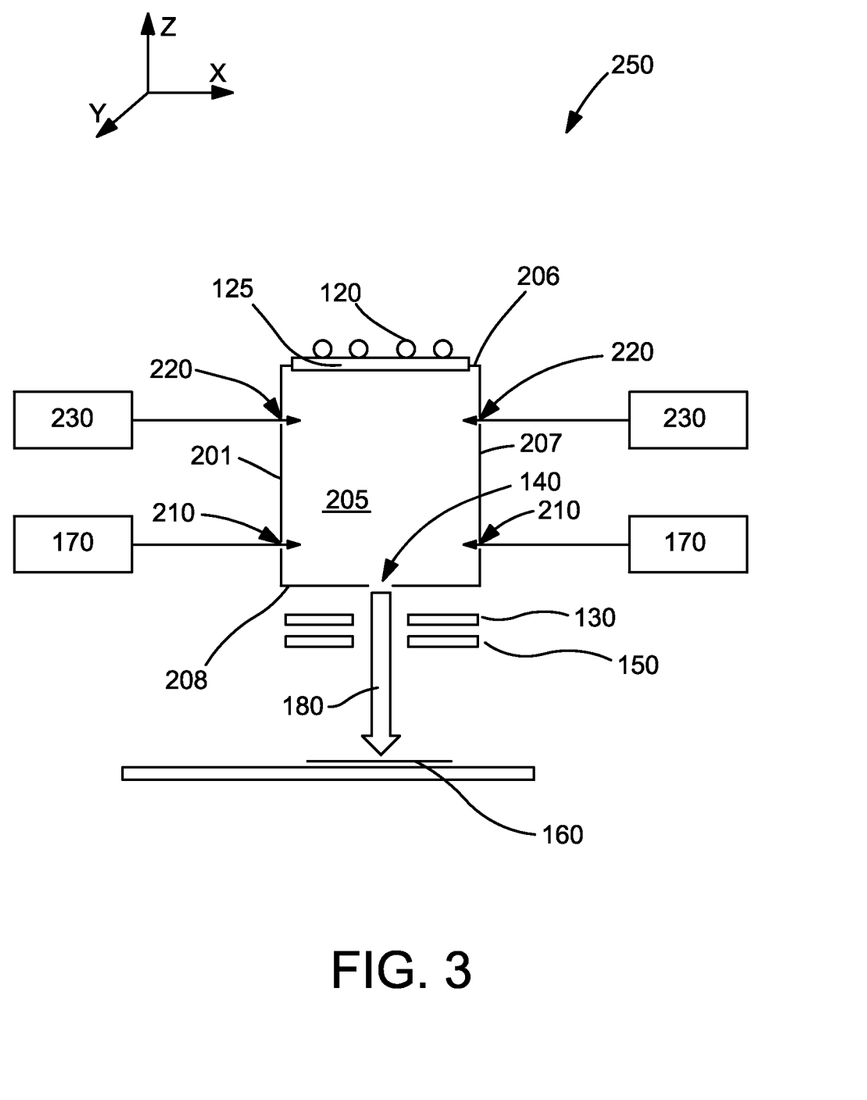
FIG. 3 shows an embodiment of an implant system that can be used in another embodiment

FIGS. 2 and 3 depicts two first gas inlets 210 for first source gas 170 and two second gas inlets 220 for second source gas 230. However, there is no limitation of the number of first and second gas inlets 210, 220 that each source gas may be introduced through. For example, more or fewer first and second gas inlets 210, 220 may be employed. Furthermore, the number of first gas inlets 210 does not need to equal the number of second gas inlets 220. Furthermore, while FIGS. 2-6 show the first gas inlets 210 and the second gas inlets 220 each disposed on opposite sidewalls, the disclosure is not limited to this embodiment. For example, the first source gas 170 may be introduced through a first gas inlet 210 located on one sidewall 207, while the second source gas 230 is introduced through a second gas inlet 220 located on a different sidewall.

In another embodiment, the RF antenna 120 may be disposed within the chamber 205 proximate the first wall 206. In this embodiment, locating the first gas inlet 210 proximate the second wall 208 opposite the first wall 206 may still reduce the contaminants caused by etching of the inner surfaces of the sidewalls 207 or of the RF antenna 120.

Figure 4:
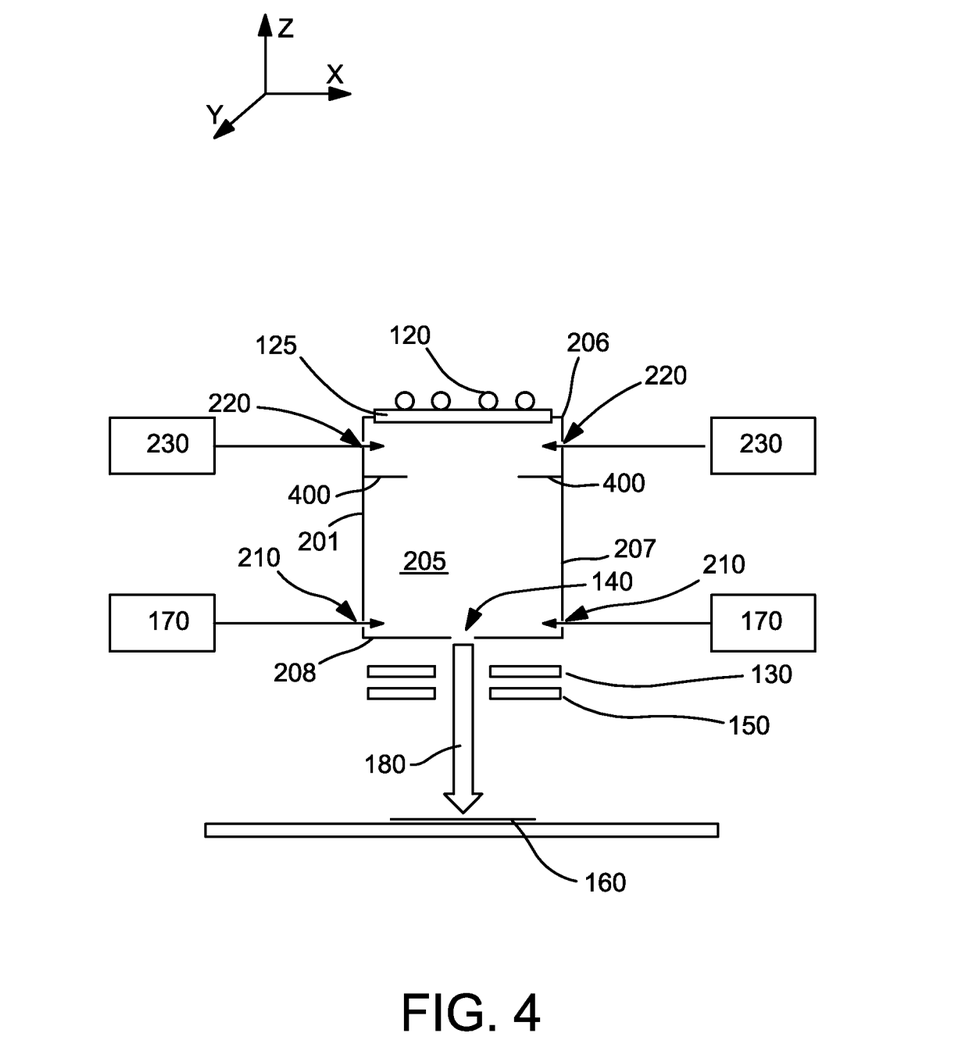
FIG. 4 shows an embodiment of an implant system that can be used in another embodiment.

This separation of the source gasses within the plasma chamber 205 may be further amplified through the addition of one or more partitions 400 disposed between the first gas inlets 210 and second gas inlets 220, as seen in FIG. 4. In one embodiment, these partitions 400 may be stationary so as to permanently affect the flow of gasses within the chamber 405, particularly the flow of first source gas 170 toward the dielectric window 125. The partitions 400 may extend through the entire length (i.e. the Y direction) of the ion source 201. In other embodiments, the partitions 400 may only extend a portion of the length of the ion source 201 in the Y direction.

Figure 5:
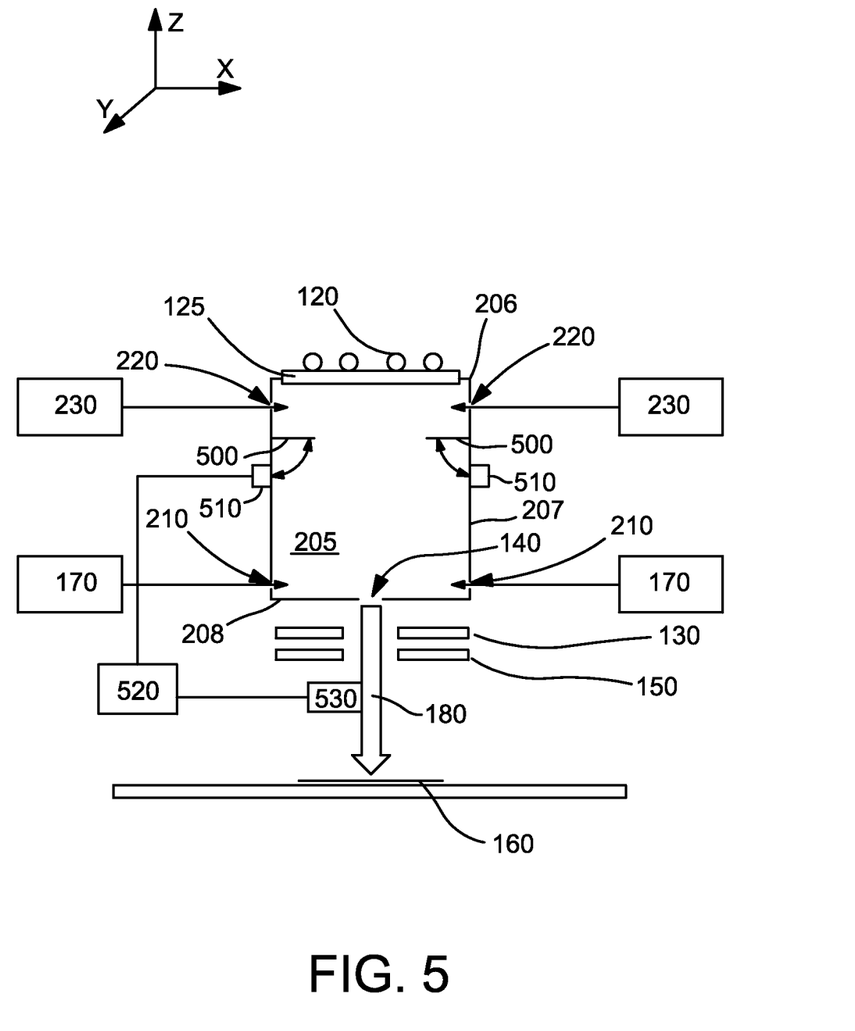
FIG. 5 shows an embodiment of an implant system that can be used in another embodiment.

In another embodiment, shown in FIG. 5, the partitions 500 may be rotatable, as indicated by arrows 510. In this way, the flow of source gasses 170, 230 within the chamber 205 can be optimized. The optimal rotation angle of the partitions 500 may be determined based on the composition of the extracted ion beam. In one embodiment, a control system 520, comprising a processing unit and an ion beam monitoring unit 530, is employed. This control system 520 comprises a memory device comprising instructions which when executed, monitor the composition of the extracted ion beam and adjust the rotation angle of the partitions 500 based thereon. These instructions may be executed continuously, such that the composition of the ion beam extracted from the ion source 201 is constantly monitored by the ion beam monitoring unit 530. In this embodiment, the partitions 500 can be rotated by the control system 520, based on the monitored extracted ion beam content. In another embodiment, a test implant is performed using the desired implant parameters and the composition of the extracted ion beam is measured. The partitions 500 are then rotated until an optimal ion beam composition has been achieved. This rotation angle is then used in the subsequent ion implants.

The partitions 500 may extend arbitrarily far into the ion source 201 in the X direction. In one embodiment, the partitions 500 each extend less than one quarter of the width of the chamber 205. In this way, at least half of the width of the chamber 205 is unobstructed by the partitions 500. Of course, the partitions 500 may extend into the chamber 205 to a greater or lesser extent, if desired. These partitions 500 may be constructed of materials commonly used within an ion source, such as graphite or silicon carbide or silicon.

In embodiments where the partitions 500 may be rotated, motors 510 may be used. In one embodiment, the sidewalls 207 of the ion source 201 may contain recesses into which the motors 510 can be inserted, thereby protecting them to some extent from the source gasses 170, 230 and ions contained within the ion source 201. The motors 510 may be piezoelectric devices, or may utilize other technologies. These motors may be in electrical communication with the control system 520, so that they may be controlled by the control system 520.

Figure 6:
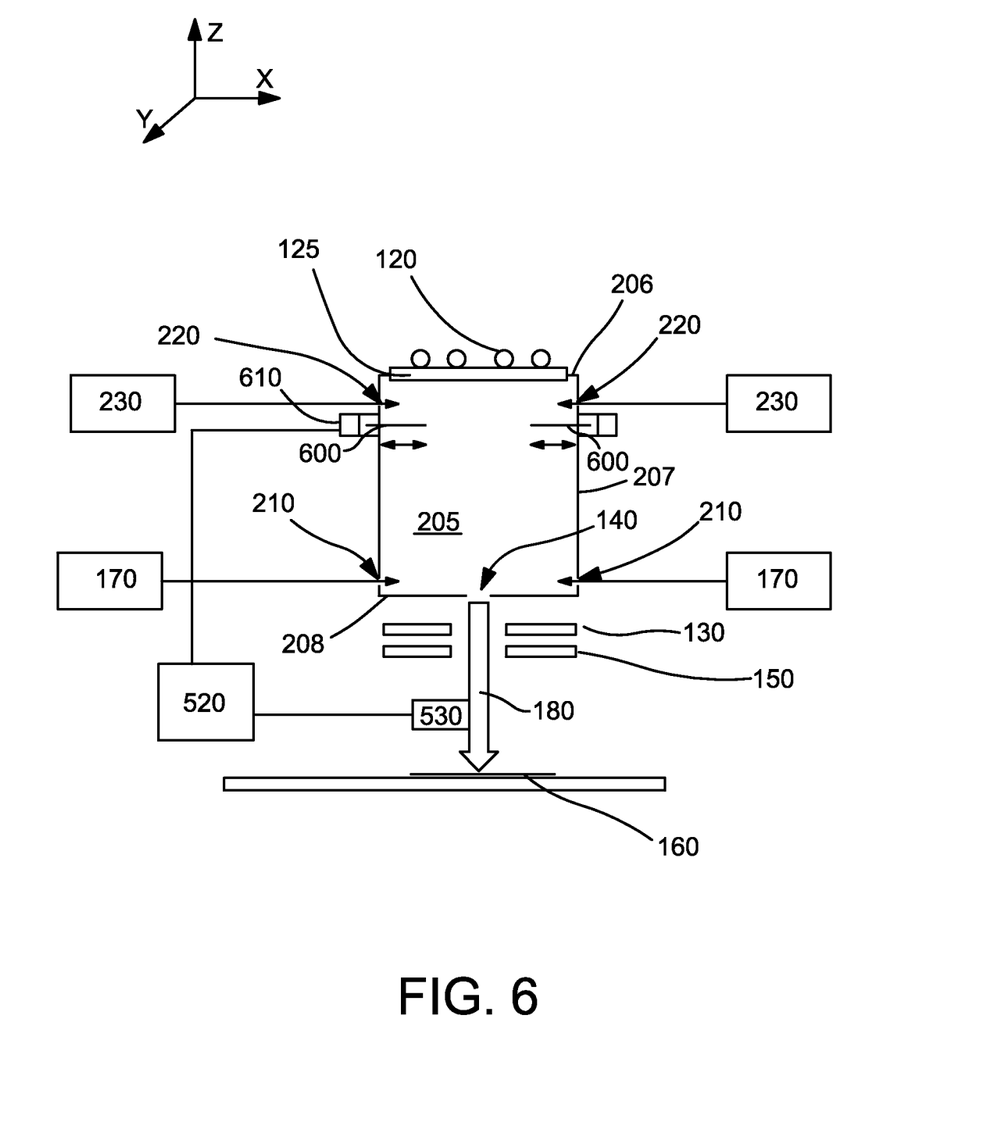
FIG. 6 shows an embodiment of an implant system that can be used in another embodiment.

FIG. 6 shows another embodiment which utilizes partitions 600. As was described in FIG. 5, the partitions 600 can be used to affect the flow of source gasses, and particularly the flow of first source gas 170 near the dielectric window 125. In this embodiment, the partitions 600 are linearly actuated using motors 610 such that the partitions 600 move linearly into and out of the chamber 405. In one embodiment, the sidewalls 207 near the partitions 600 are made thicker, or formed with a pocket, so that the partitions 600 can retract entirely into the sidewalls 207. The amount that the partitions 600 extend into the chamber 205 can be determined according to the methods described above. As described above, control system 520 and ion beam monitoring unit 530 are used to determine the composition of the ion beam and control the motors 610 accordingly.

In some embodiments, the partitions 500, 600 of FIGS. 5 and 6, respectively, are comprised of a plurality of smaller subpartitions that extend along the length of the ion source 400, in the Y direction. Each of these subpartitions may be independently controlled by the control system 520. These subpartitions may serve several purposes. For example, ion source 201 may be configured such that its length (i.e. the Y dimension) is much greater than its width (i.e. the X dimension), such that a ribbon beam may be extracted through the aperture 140. The composition of the extracted ion beam may vary along the Y dimension of the ion source 400. Thus, independent control of various portions of the ion beam along the Y dimension may allow better control of ion beam quality. Secondly, the ion beam current may vary as a function of the Y dimension of a ribbon beam. Therefore, independent control of the subpartitions along the Y dimension of the ribbon beam may be useful in equalizing the ion beam current across the entire length of the ribbon beam.

Figure 8:
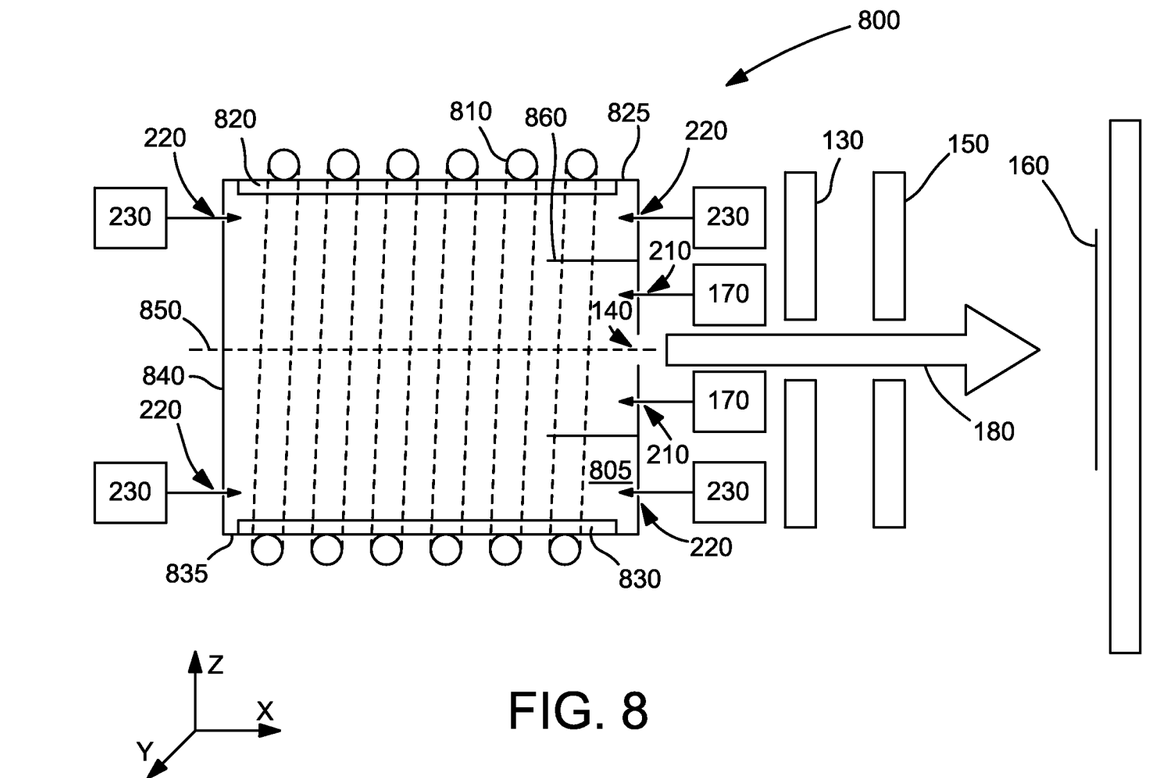
FIG. 8 shows an embodiment of an implant system that can be used in another embodiment.

While FIGS. 2-7 show embodiments in which the RF antenna 120 is disposed on or near one wall of the chamber, such as first wall 206, other embodiments are possible. FIG. 8 shows an implant system 800 using a helical antenna 810, which wraps around the chamber 805. First and second dielectric windows 820, 830 may be disposed on opposite walls, such as first wall 825 and second wall 835, respectively. Aperture 140 may be disposed on one of the sidewalls 840. The aperture 140 is preferably disposed along centerline 850, which is equidistant between first wall 825 and second wall 835. In this embodiment, the critical dimension of the chamber 805 may be defined as the distance in the Z direction from either the first wall 825 or the second wall 835 to the centerline 850. Thus, the critical dimension is defined as half of the height of the chamber 805. The second source gas 230 is introduced through one or more second gas inlets 220, which may be disposed along one or more of sidewalls 840. The distance from these second gas inlets 220 and the closest wall having a dielectric window (i.e. first wall 825 or second wall 835) is less than 35% of the critical dimension. In some embodiments, this distance may be less than 25%. In other embodiments, this distance may be less than 10%. Similarly, the first source gas 170 may by introduced through first gas inlets 210, disposed on one or more sidewalls 840. In some embodiments, the first gas inlets 210 are disposed only on the sidewall having the aperture 140. In some embodiments, the distance from the first gas inlet 170 to the centerline is less than 35% of the critical dimension. In other embodiments, this distance is less than 25% of the critical dimension. In other embodiments, this distance may be less than 10% of the critical dimension. Furthermore, one or more partitions 860 may optionally be disposed on one or more of the sidewalls 840 between the first gas inlet 210 and the second gas inlet 220. The length of these partitions 860 in the X-direction may be, for example, between 10-50% of the length of the chamber 805. As described above, these partitions 860 may also be movable in some embodiments.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implant system, comprising:
    an ion source, having a chamber defined by a plurality of chamber walls;
    an RF antenna disposed on a first wall of said plurality of chamber walls;
    a second wall, opposite said first wall, the distance between said first wall and said second wall defining the height of the chamber;
    an aperture disposed on one of said plurality of chamber walls;
    a first gas inlet for introducing a first source gas to said chamber; and
    a second gas inlet for introducing a second source gas, different from the first source gas, to said chamber;
    wherein a first distance from said first gas inlet to said second wall is less than 35% of said height; and
    a second distance from said second gas inlet to said first wall is less than 35% of said height.

2. The ion implant system of claim 1, wherein said aperture is disposed in said second wall.

3. The ion implant system of claim 1, wherein said aperture is disposed in a sidewall, different from said first wall and said second wall.

4. The ion implant system of claim 1, further comprising a dielectric window in said first wall, disposed between said RF antenna and said chamber.

5. The ion implant system of claim 1, wherein said first distance and said second distance are each less than 25% of said height.

6. The ion implant system of claim 1, wherein said first distance and said second distance are each less than 10% of said height.

7. The ion implant system of claim 1, wherein said first source gas comprises a dopant and a halogen.

8. The ion implant system of claim 1, wherein said second source gas comprises a dopant and a hydride.

9. The ion implant system of claim 1, comprising a partition disposed in said chamber between said first gas inlet and said second gas inlet.

10. The ion implant system of claim 8, wherein said partition is movable, and said partition is moved based on monitored ion beam composition.

11. An ion implant system, comprising:
    an ion source, having a chamber defined by a plurality of chamber walls;
    a first dielectric window disposed on a first wall of said plurality of chamber walls and a second dielectric wall disposed on a second wall, opposite said first wall, wherein a centerline is defined as equidistant from said first wall and said second wall, and the distance between said first wall and centerline defining a critical dimension of the chamber; and an RF antenna disposed on said first dielectric window and said second dielectric window and outside said chamber;

an aperture disposed on one of said plurality of chamber walls, different from said first wall and said second wall, along said centerline;

a first gas inlet for introducing a first source gas to said chamber; and a second gas inlet for introducing a second source gas, different from the first source gas, to said chamber;

wherein a first distance from said first gas inlet to said centerline is less than 35% of said critical dimension; and a second distance from said second gas inlet to said first wall is less than 35% of said critical dimension.

12. The ion implant system of claim 11, wherein said first distance and said second distance are each less than 25% of said height.

13. The ion implant system of claim 11, wherein said first distance and said second distance are each less than 10% of said height.

14. The ion implant system of claim 11, wherein said first source gas comprises a dopant and a halogen.

15. The ion implant system of claim 11, wherein said second source gas comprises a dopant and a hydride.

16. The ion implant system of claim 11, comprising a partition disposed in said chamber between said first gas inlet and said second gas inlet.

17. The ion implant system of claim 11, comprising a partition disposed in said chamber between said first gas inlet and said second gas inlet.

18. An ion implant system, comprising:

an ion source, having a chamber defined by a plurality of chamber walls;

a dielectric window disposed on a first wall of said plurality of chamber walls;

an RF antenna disposed proximate said dielectric window, outside said chamber;

a second wall, opposite said first wall, the distance between said first wall and said second wall defining the height of the chamber;

an aperture disposed on said second wall;

a first gas inlet for introducing a first source gas to said chamber; and a second gas inlet for introducing a second source gas, different from the first source gas, to said chamber;

wherein a first distance from said first gas inlet to said second wall is less than 10% of said height; and a second distance from said second gas inlet to said first wall is less than 10% of said height.

19. The ion implant system of claim 18, wherein said first source gas comprises boron and a halogen, and said second gas comprises boron and a hydride.

20. The ion implant system of claim 18, comprising a partition disposed in said chamber between said first gas inlet and said second gas inlet.

* * * * *